(12) United States Patent
Lee et al.

(10) Patent No.: US 7,307,308 B2
(45) Date of Patent: Dec. 11, 2007

(54) BURIED BIT LINE NON-VOLATILE FLOATING GATE MEMORY CELL WITH INDEPENDENT CONTROLLABLE CONTROL GATE IN A TRENCH, AND ARRAY THEREOF, AND METHOD OF FORMATION

(75) Inventors: Dana Lee, Santa Clara, CA (US); Bomy Chen, Cupertino, CA (US); Sohrab Kianian, Los Altos Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 249 days.

(21) Appl. No.: 10/797,296

(22) Filed: Mar. 9, 2004

(65) Prior Publication Data

US 2004/0253787 A1    Dec. 16, 2004

Related U.S. Application Data

(63) Continuation-in-part of application No. 10/409,407, filed on Apr. 7, 2003, now Pat. No. 7,190,018.

(51) Int. Cl.
*H01L 29/788*    (2006.01)
*H01L 21/336*    (2006.01)

(52) U.S. Cl. ..................... 257/316; 438/266
(58) Field of Classification Search ............ None
See application file for complete search history.

(56) References Cited

U.S. PATENT DOCUMENTS

| | | |
|---|---|---|
| 5,021,999 A | 6/1991 | Kohda et al. |
| 5,029,130 A | 7/1991 | Yeh |
| 5,739,567 A | 4/1998 | Wong |
| 6,093,945 A | 7/2000 | Yang |
| 6,103,573 A | 8/2000 | Harari et al. |

(Continued)

OTHER PUBLICATIONS

IEEE, 2002, entitled "Quantum-well Memory Device (QW/MD) With Extremely Good Charge Retention," Z. Krivokapic, et al. (4 pages).

*Primary Examiner*—Kiesha Rose
(74) *Attorney, Agent, or Firm*—DLA Piper US LLP

(57) ABSTRACT

A buried bit line read/program non-volatile memory cell and array is capable of achieving high density. The cell and array is made in a semiconductor substrate which has a plurality of spaced apart trenches, with a planar surface between the trenches. Each trench has a side wall and a bottom wall. Each memory cell has a floating gate for storage of charges thereon. The cell has spaced apart source/drain regions with a channel therebetween, with the channel having two portions. One of the source/drain regions is in the bottom wall of the trench. The floating gate is in the trench and is is over a first portion of the channel and is spaced apart from the side wall of the trench. A gate electrode controls the conduction of the channel in the second portion, which is in the planar surface of the substrate. The other source/drain region is in the substrate in the planar surface of the substrate. An independently controllable control gate is also in the trench, insulated from the floating gate and is capacitively coupled thereto. The cell programs by hot channel electron injection, and erases by Fowler-Nordheim tunneling of electrons from the floating gate to the gate electrode or from the floating gate to the source/drain region at the bottom wall of the trench. The source, drain and control gates are all substantially parallel to one another, with the gate electrode substantially perpendicular to the source/drain/control gates. The source/drain lines are buried in the substrate, creating a virtual ground array.

20 Claims, 12 Drawing Sheets

U.S. PATENT DOCUMENTS

| | | |
|---|---|---|
| 6,281,545 B1 | 8/2001 | Liang et al. |
| 6,420,231 B1 | 7/2002 | Harari et al. |
| 6,426,896 B1 | 7/2002 | Chen |
| 6,541,815 B1 * | 4/2003 | Mandelman et al. ....... 257/315 |
| 6,597,036 B1 | 7/2003 | Lee et al. |
| 6,952,034 B2 * | 10/2005 | Hu et al. .................... 257/315 |
| 2002/0056870 A1 | 5/2002 | Lee et al. |
| 2002/0163031 A1 | 11/2002 | Lee et al. |

* cited by examiner

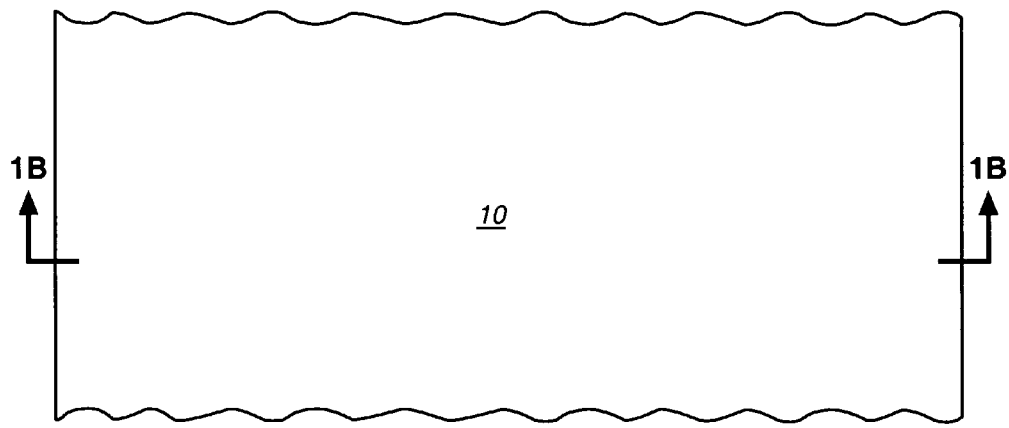
FIG._1A
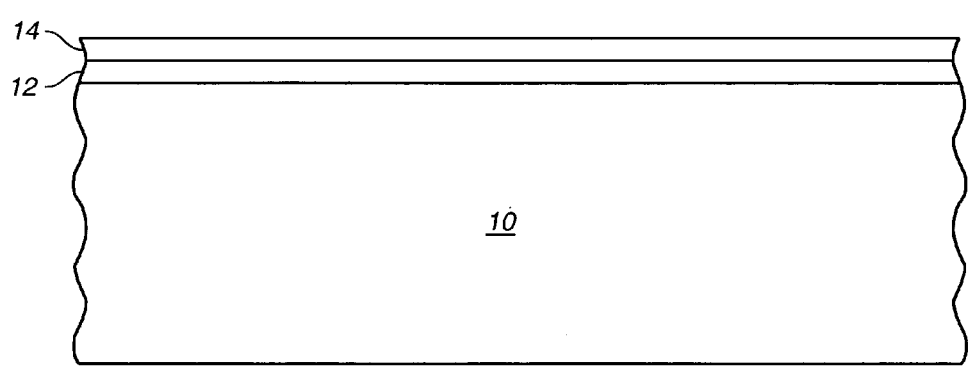
FIG._1B
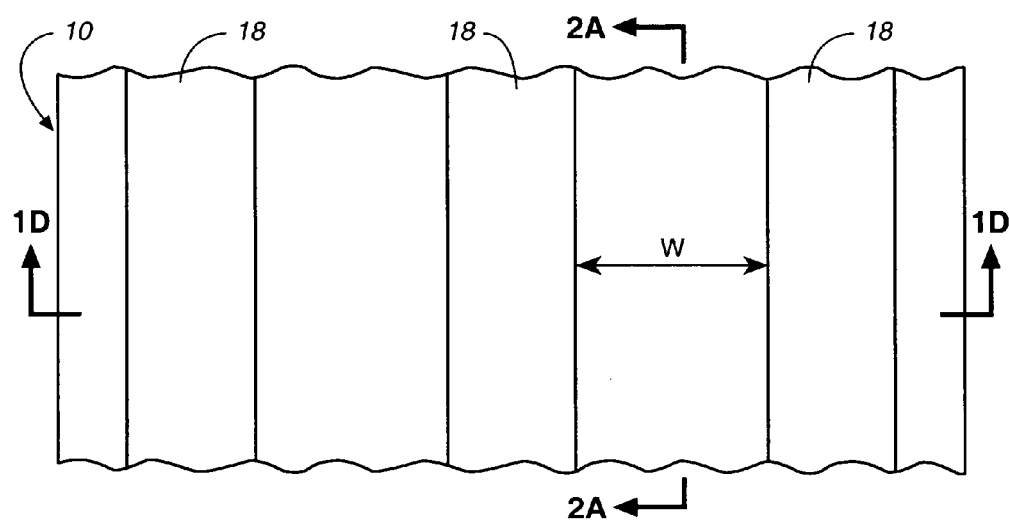
FIG._1C

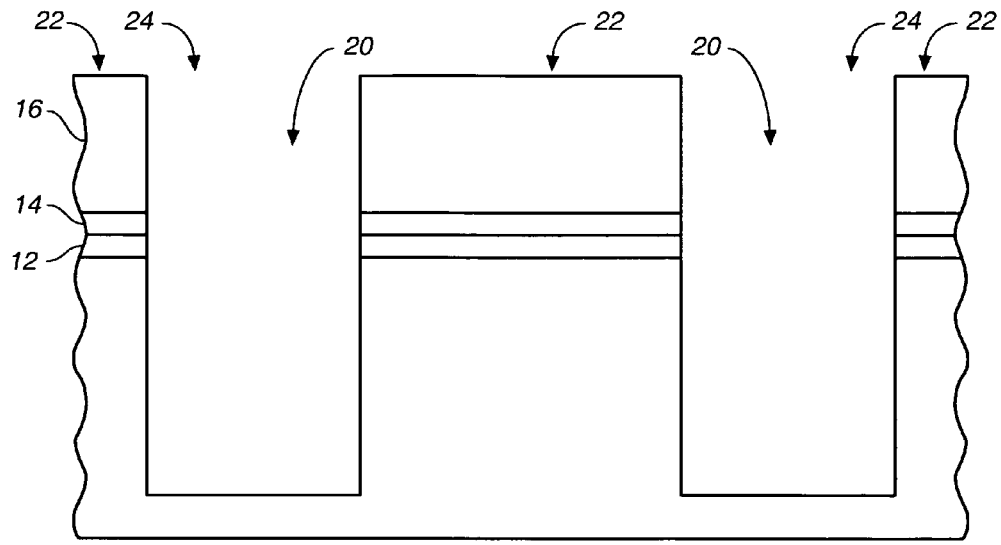
FIG._1D
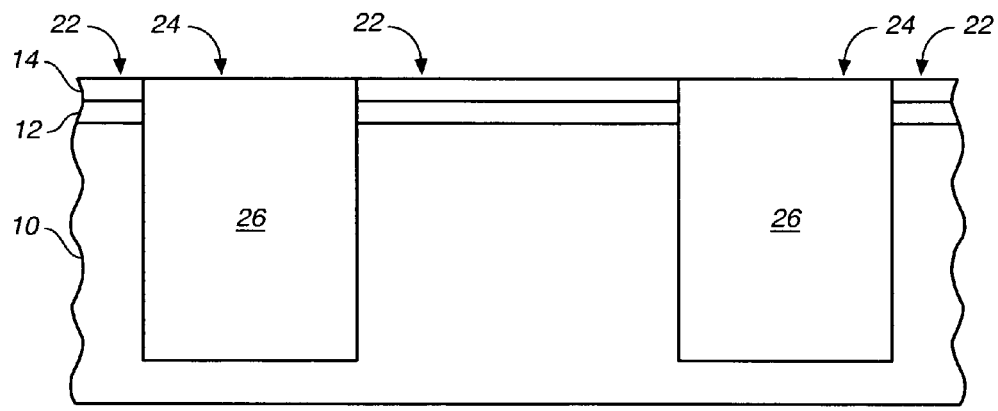
FIG._1E
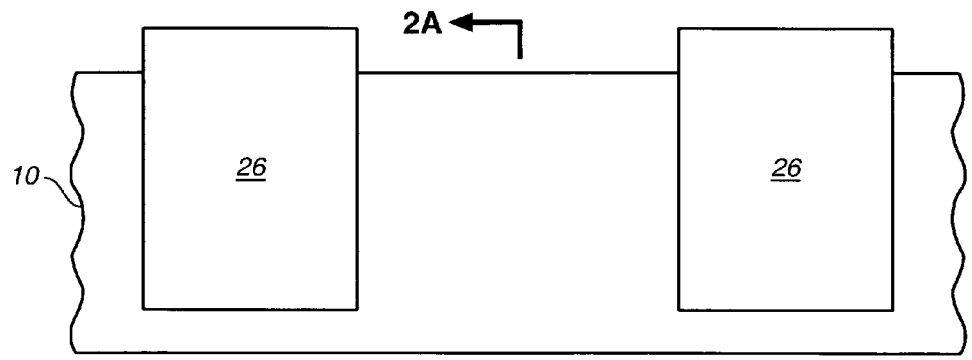
FIG._1F

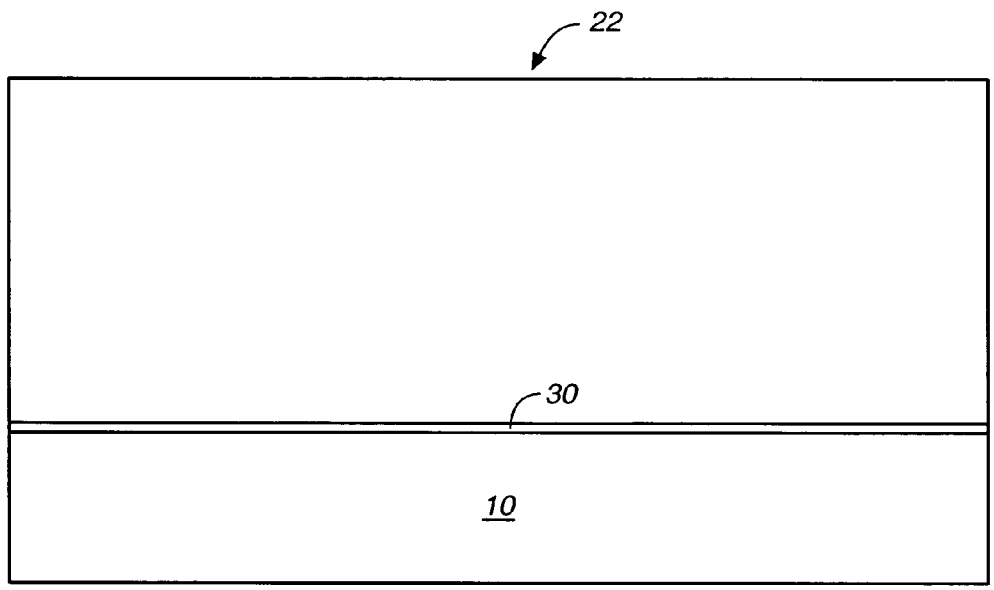
FIG._2A
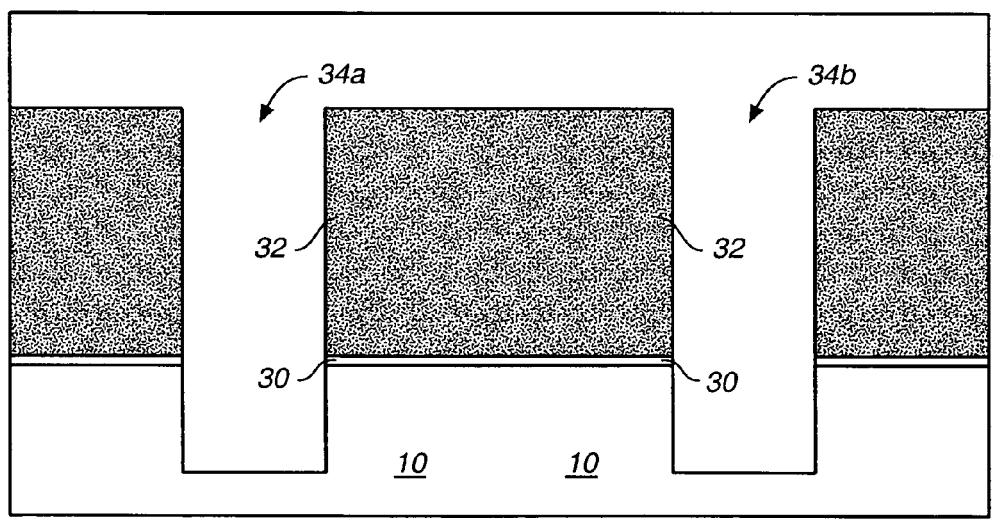
FIG._2B

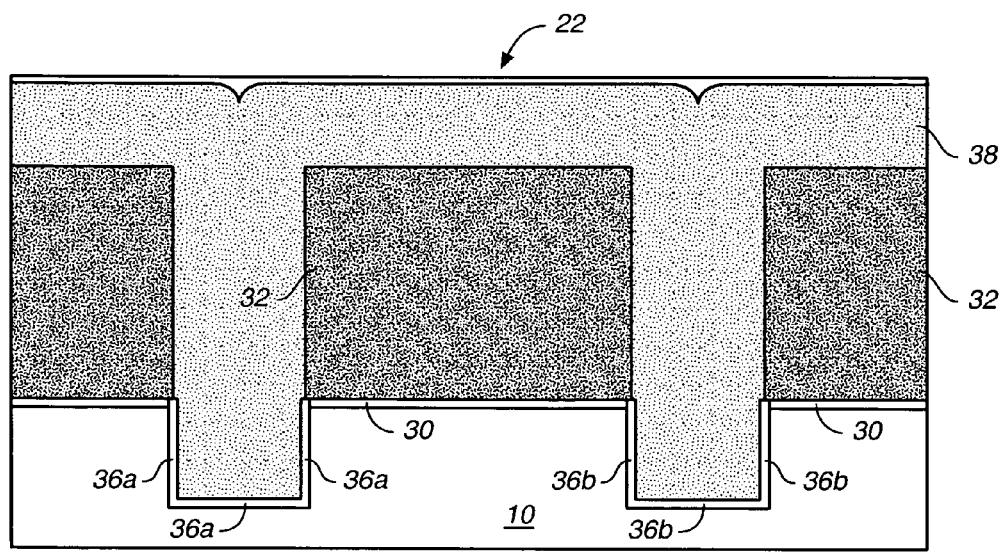
FIG._2C
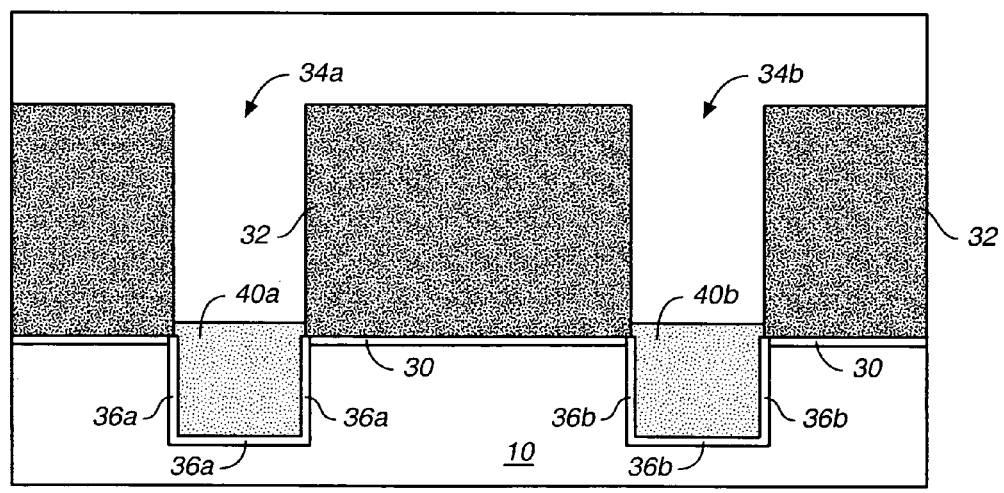
FIG._2D

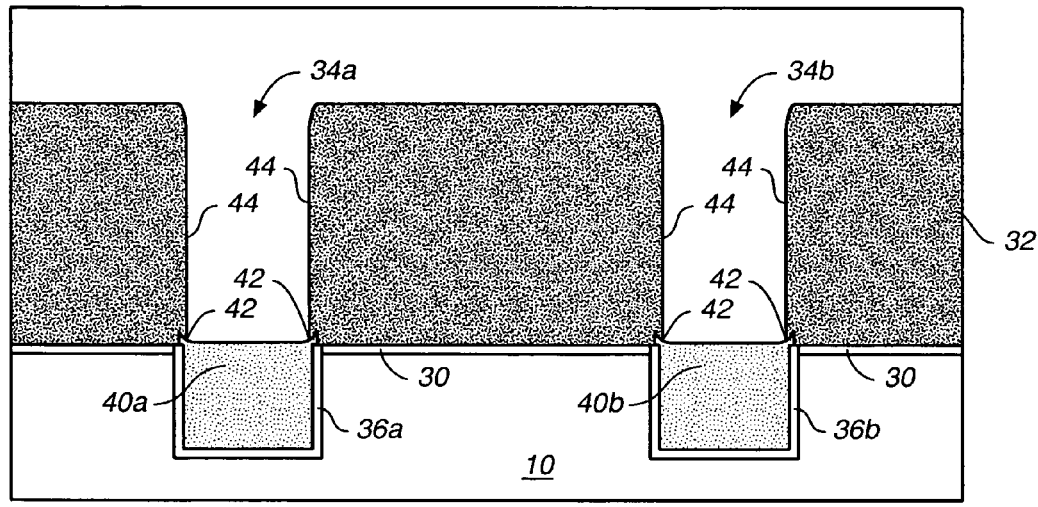
FIG._2E
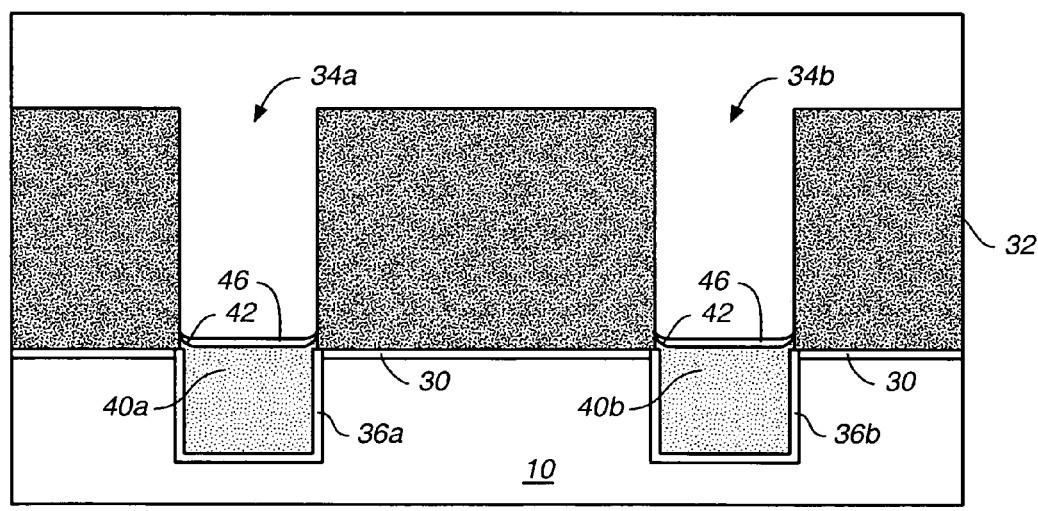
FIG._2F

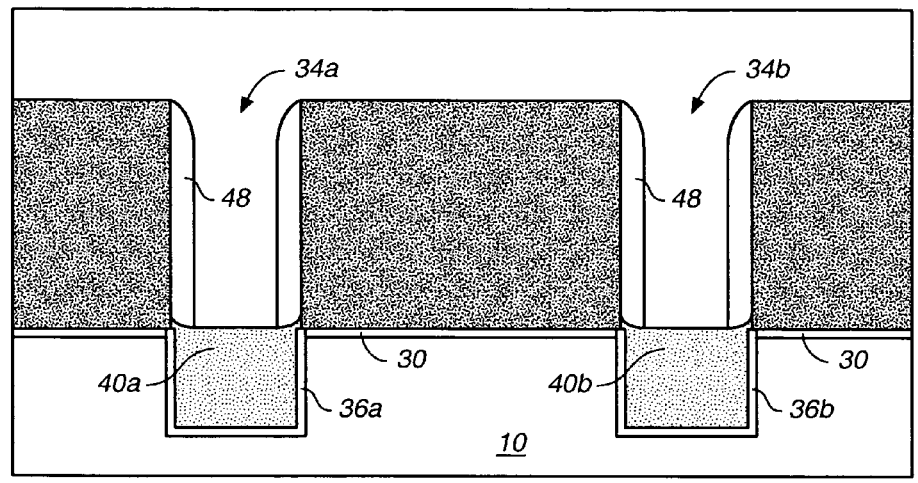
FIG._2G
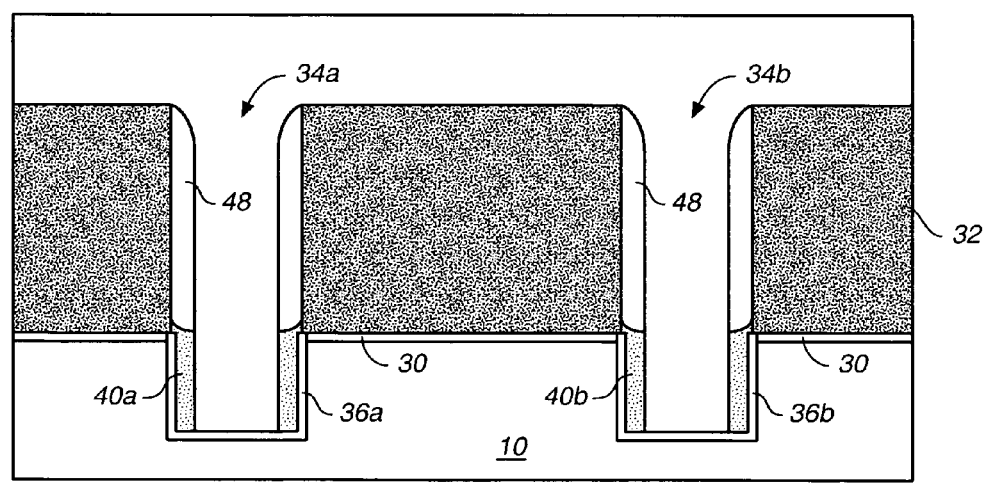
FIG._2H

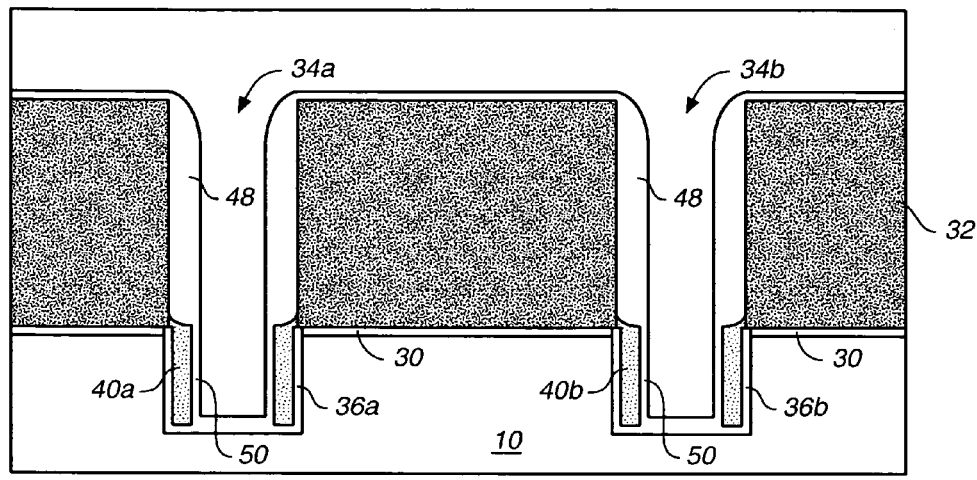
FIG._2I
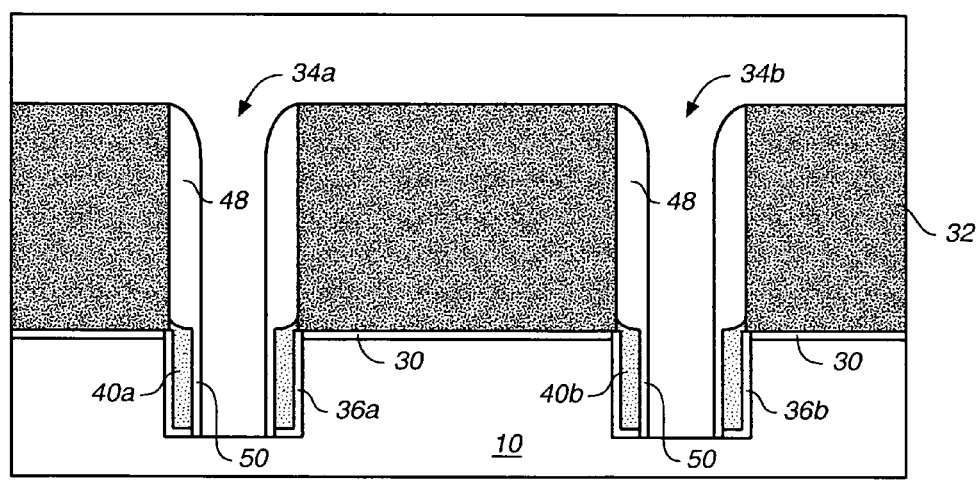
FIG._2J

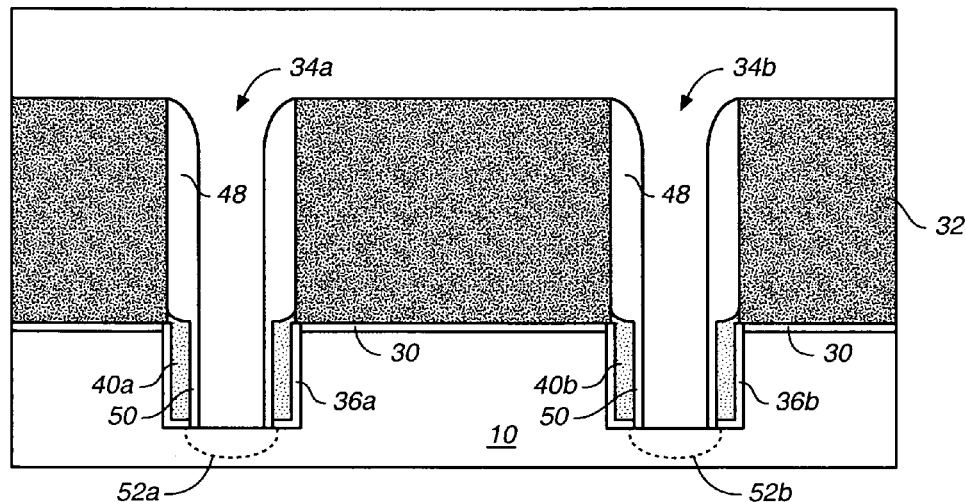
FIG._2K
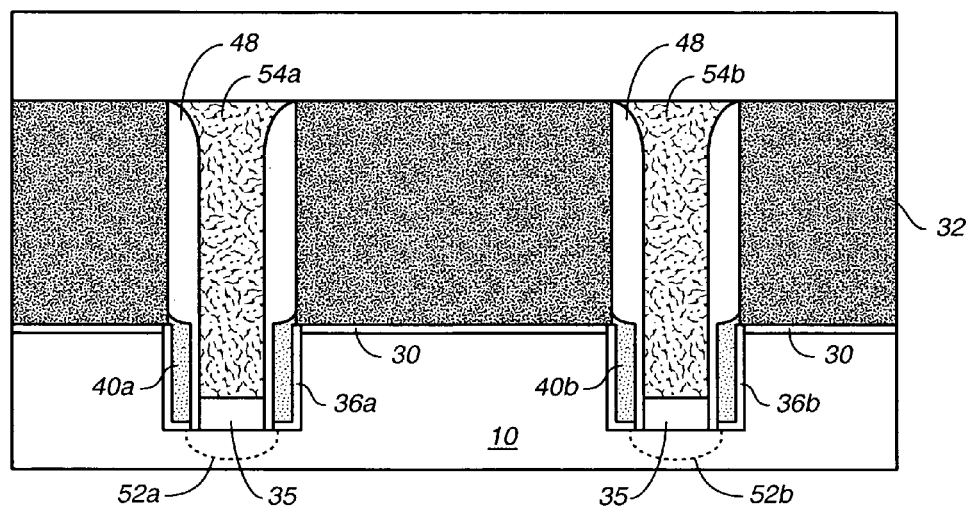
FIG._2L

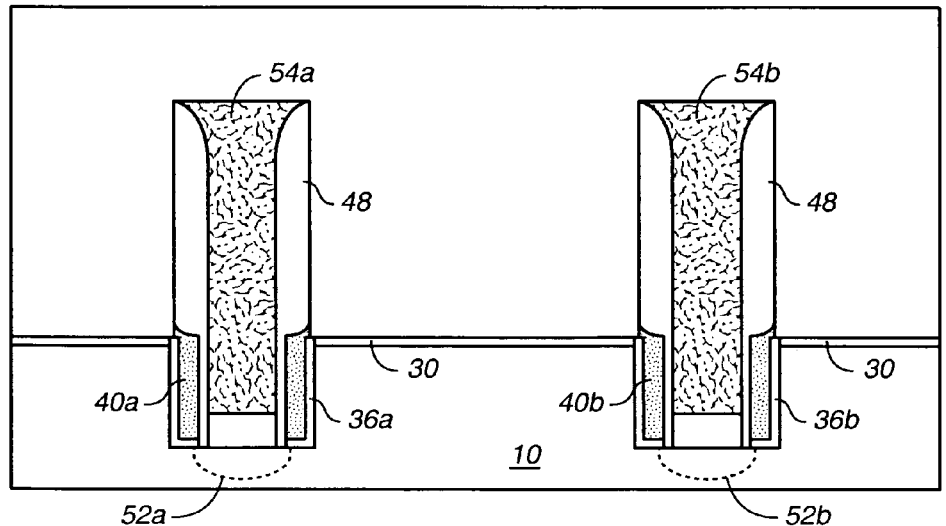
FIG._2M
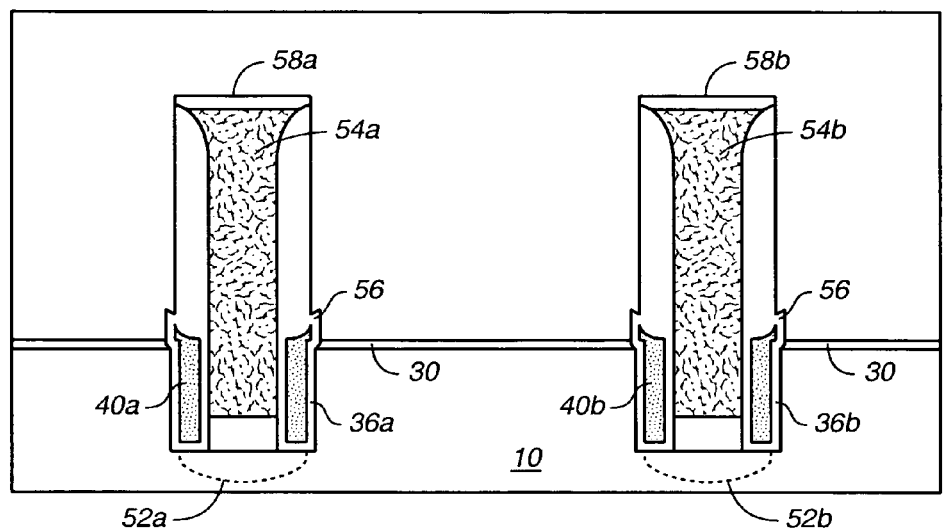
FIG._2N

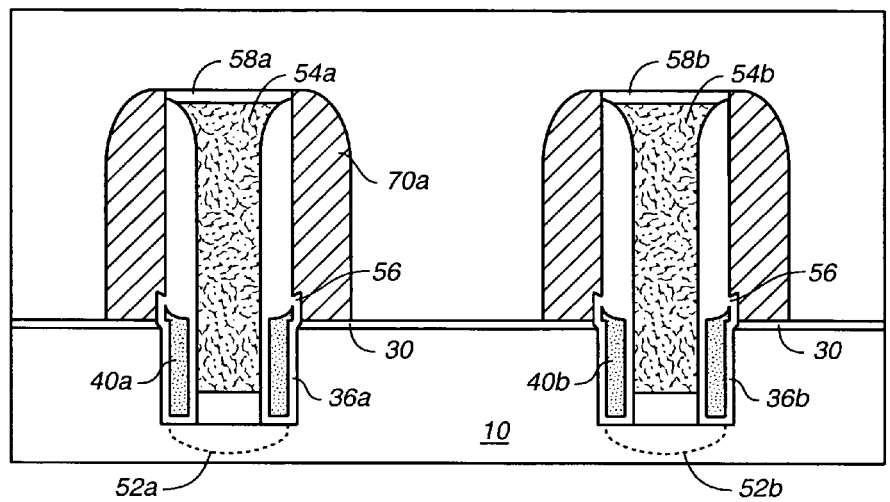
FIG._2O
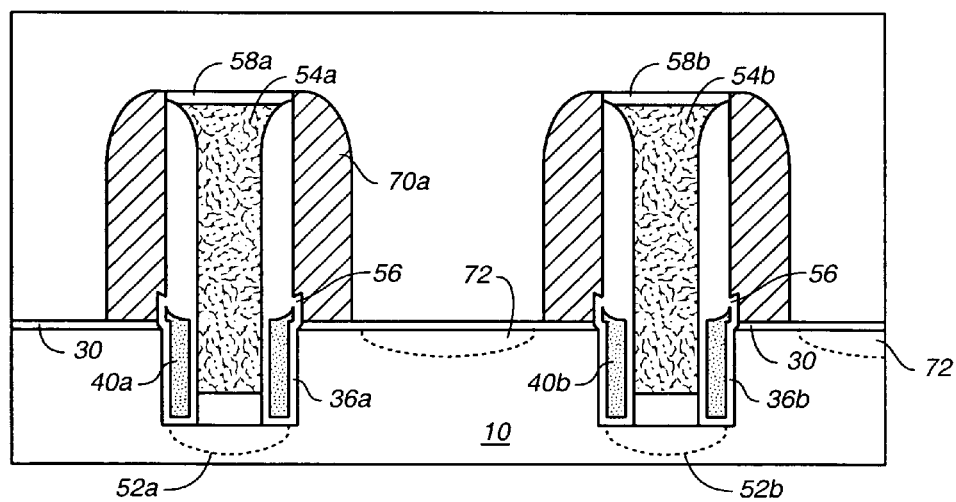
FIG._2P

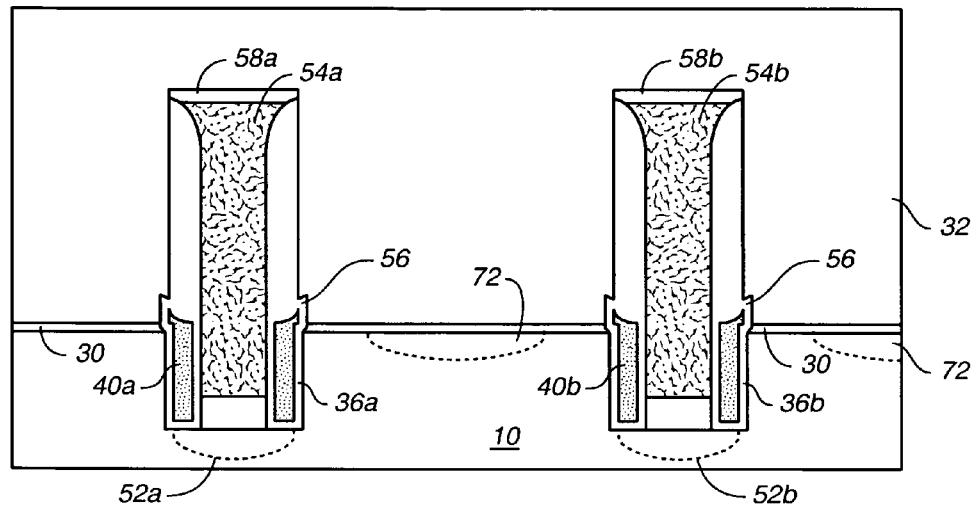
FIG._2Q
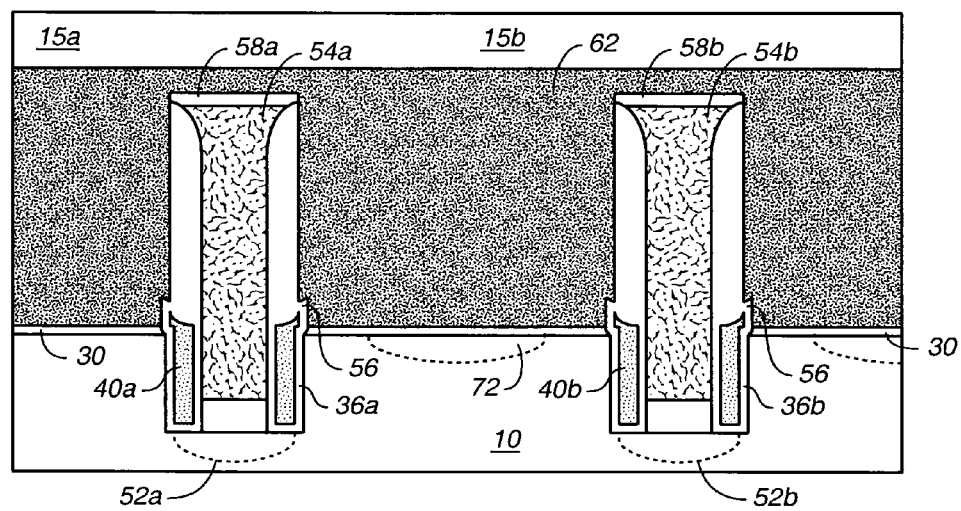
FIG._2R

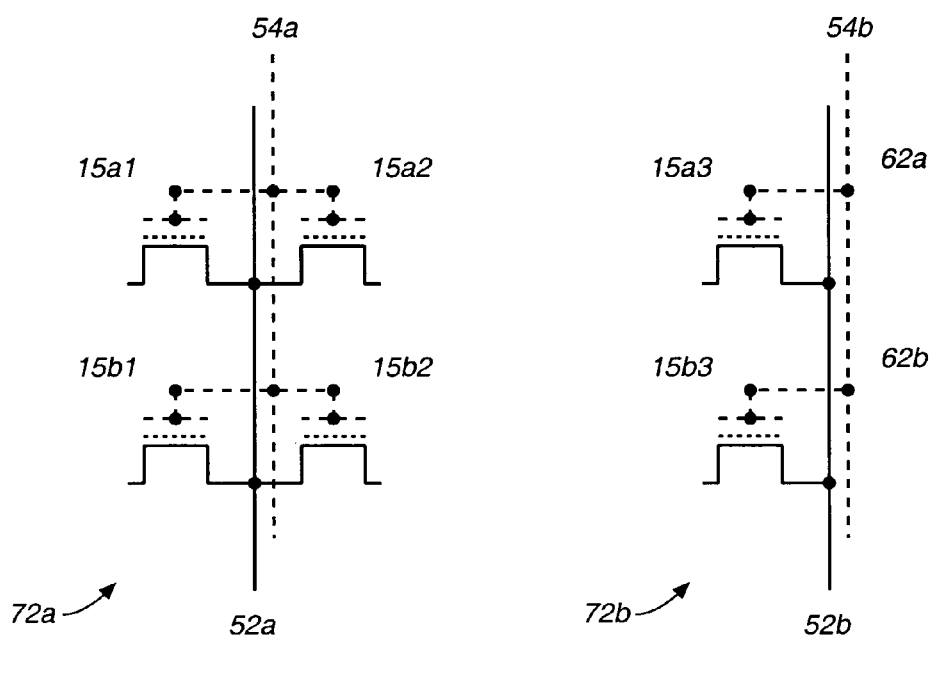
FIG._3

BURIED BIT LINE NON-VOLATILE FLOATING GATE MEMORY CELL WITH INDEPENDENT CONTROLLABLE CONTROL GATE IN A TRENCH, AND ARRAY THEREOF, AND METHOD OF FORMATION

The application is a continuation in part of an application filed on Apr. 7, 2003, Ser. No. 10/409,407 now U.S. Pat. No. 7,190,018, whose disclosure is incorporated herein in its entirety.

TECHNICAL FIELD

The present invention relates to a buried bit line read/program non-volatile memory cell, that uses a floating gate for storage of charges with the floating gate in a trench. More particularly, the present invention relates to such non-volatile memory cell that has an independent controllable control gate also in the trench capacitively coupled to the floating gate and an array of such cells, and a method of manufacturing.

BACKGROUND OF THE INVENTION

Read/program non-volatile memory cells using floating gate for storage formed on a planar surface of a semiconductor substrate are well known in the art. See for example, U.S. Pat. Nos. 5,029,130 and 6,426,896. Typically, each of these types of memory cells is formed on the horizontal plane of a semiconductor substrate, and involve the programming of the floating gate by hot electron injection and the erasure of electrons from the floating gate by poly-to-poly Fowler-Nordheim tunneling. The floating gate either stores charges or does not. The charges stored on a floating gate control the conduction of charges in the planar channel of a transistor. As the scale of integration increases with semiconductor processing, it becomes desirable to increase the density of such memory devices.

However, as demand for increased density memory increases, there is a need to increase the density of such cells in a semiconductor substrate.

SUMMARY OF THE INVENTION

In the present invention, a non-volatile memory cell is made in a substantially single crystalline semiconductive material of a first conductivity type which has a substantially planar surface with a trench in the surface of the material. The trench has a sidewall and a bottom wall. A first region of a second conductivity type, different from the first conductivity type is in the material along the planar surface. A second region of the second conductivity type is in the material along the bottom wall of the trench. A channel region has a first portion and a second portion, connecting the first region and the second region for the conduction of charges. The first portion is along the surface adjacent to the first region, and the second portion is along the sidewall adjacent to the second region. A dielectric is on the channel region. A floating gate is in the trench, on the dielectric, spaced apart from the second portion of the channel region. A first gate electrode is on the dielectric, spaced apart from the first portion of the channel region. A second gate electrode is in the trench, capacitively coupled to the floating gate.

The present invention also relates to an array of the foregoing described non-volatile memory cells, and a method of making the non-volatile memory cell and the array.

BRIEF DESCRIPTION OF THE DRAWINGS

FIG. 1A is a top view of a semiconductor substrate used in the first step of the method of present invention to form isolation regions.

FIG. 1B is a cross sectional view of the structure taken along the line 1B-1B showing the initial processing steps of the present invention.

FIG. 1C is a top view of the structure showing the next step in the processing of the structure of FIG. 1B, in which isolation regions are defined.

FIG. 1D is a cross sectional view of the structure in FIG. 1C taken along the line 1D-1D showing the isolation trenches formed in the structure.

FIG. 1E is a cross sectional view of the structure in FIG. 1D showing the formation of isolation blocks of material in the isolation trenches.

FIG. 1F is a cross sectional view of the structure in FIG. 1E showing the final structure of the isolation regions.

FIGS. 2A-2R are cross sectional views of the semiconductor structure in FIG. 1F taken along the line 2A-2A showing in sequence the steps in the processing of the semiconductor structure in the formation of a non-volatile memory array of floating gate memory cells of the present invention.

FIG. 3 is a schematic circuit diagram of the memory cell array of the present invention.

DETAILED DESCRIPTION OF THE INVENTION

The method of the present invention is illustrated in FIGS. 1A to 1F and 2A to 2R, which show the processing steps in making the memory cell array of the present invention. The method begins with a semiconductor substrate 10, which is preferably of P type and is well known in the art. The thickness of the layers described below will depend upon the design rules and the process technology generation. What is described herein is for the 0.10 micron process. However, it will be understood by those skilled in the art that the present invention is not limited to any specific process technology generation, nor to any specific value in any of the process parameters described hereinafter.

Isolation Region Formation

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 60-150 angstroms. Second layer 14 can be silicon nitride (hereinafter "nitride"), which is formed over oxide layer 12 preferably by CVD to a thickness of approximately 1000-2000 angstroms. FIG. 1B illustrates a cross-section of the resulting structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide etch processes) to form trenches 20 in the structure. The distance W between adjacent stripes 18 can be as small as the smallest lithographic feature of the process used. A silicon etch process is then used to extend trenches 20 down into the silicon substrate 10 to a depth of approximately 500-4000 angstroms, as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

The structure is further processed to remove the remaining photo resist 16. Then, an isolation material such as silicon dioxide is formed in first trenches 20 by depositing a thick oxide layer, followed by a Chemical-Mechanical-Polishing or CMP etch (using nitride layer 14 as an etch stop) to remove the oxide layer except for oxide blocks 26 in first trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18. FIGS. 1A to 1F illustrate the memory cell array region of the substrate, in which columns of memory cells will be formed in the active regions 22 which are separated by the isolation regions 24. It should be noted that the substrate 10 also includes at least one periphery region in which control circuitry is formed that will be used to operate the memory cells formed in the memory cell array region. Preferably, isolation blocks 26 are also formed in the periphery region during the same STI or LOCOS process described above.

Memory Cell Formation

The structure shown in FIG. 1F is further processed as follows. FIGS. 2A to 2Q show the cross sections of the structure in the active regions 22 from a view orthogonal to that of FIG. 1F (along line 2A-2A as shown in FIGS. 1C and 1F).

An insulation layer 30 (preferably oxide) is first formed over the substrate 10, as shown in FIG. 2A. The active region 22 portion of the substrate 10 can be doped at this time for better independent control of the cell array portion of the memory device relative to the periphery region. Such doping is often referred to as a Vt implant or cell well implant, and is well known in the art. During this implant, the periphery region is protected by a photo resist layer, which is deposited over the entire structure and removed from just the memory cell array region of the substrate.

Next, a thick layer of hard mask material 32 such as nitride is formed over oxide layer 30 (e.g. ~3500 Å thick). A plurality of parallel second trenches 34 are formed in the nitride layer 32 by applying a photo resist (masking) material on the nitride layer 32, and then performing a masking step to remove the photo resist material from selected parallel stripe regions. An anisotropic nitride etch is used to remove the exposed portions of nitride layer 32 in the stripe regions, leaving second trenches 34 that extend down to and expose oxide layer 30. After the photo resist is removed, an anisotropic oxide etch is used to remove the exposed portions of oxide layer 30 and extend second trenches 34 down to the substrate 10. A silicon anisotropic etch process is then used to extend second trenches 34 down into the substrate 10 in each of the active regions 22 (for example, down to a depth of approximately one feature size deep, e.g. about 0.15 um deep with 0.15 um technology). Alternately, the photo resist can be removed after trenches 34 are formed into the substrate 10. The resulting active region 22 is shown in FIG. 2B.

A layer of insulation material 36 is next formed (preferably using a thermal oxidation process) along the exposed silicon in second trenches 34 that forms the bottom and lower sidewalls of the second trenches 34 (e.g. ~70 Å to 120 Å thick). A thick layer of polysilicon 38 (hereinafter "poly") is then formed over the structure, which fills second trenches 34. Poly layer 38 can be doped (e.g. n+) by ion implant, or by an in-situ process. The resulting active region 22 is shown in FIG. 2C.

A poly etch process (e.g. a CMP process using nitride layer 32 as an etch stop) is used to remove poly layer 38 except for blocks 40 of the polysilicon 38 left remaining in second trenches 34. A controlled poly etch is then used to lower the height of poly blocks 40, where the tops of poly blocks 40 are disposed above the surface of the substrate, but below the tops of STI blocks 26 in the isolation regions 24, as shown in FIG. 2D.

Another poly etch is then performed to create sloped portions 42 on the tops of poly blocks 40 (adjacent the second trench sidewalls). Nitride spacers 44 are then formed along the second trench sidewalls and over the sloped portions 42 of poly blocks 40. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 44 can be formed of any dielectric material, such as oxide, nitride, etc. In the present embodiment, insulating spacers 44 are formed by depositing a layer of nitride over the entire structure, followed by an anisotropic nitride etch process, such as the well known Reactive Ion Etch (RIE), to remove the deposited nitride layer except for spacers 44. The resulting active region 22 is shown in FIG. 2E. It should be noted that the formation of nitride spacers 44 is optional, as the spacers 44 are used to enhance the sharpness of the tips formed by the sloped portions 42 of poly blocks 40. Thus, FIGS. 2F-2R show the remaining processing steps without the optional nitride spacers 44.

A thermal oxidation process is then performed, which oxidizes the exposed top surfaces of the poly blocks 40 (forming oxide layer 46 thereon), as shown in FIG. 2F. Oxide spacers 48 (shown in FIG. 2G) are then formed along the sidewalls of the second trenches 34 by depositing oxide over the structure (e.g. approximately 350 Å thickness) followed by an anisotropic oxide etch. The oxide etch also removes the center portion of oxide layer 46 in each of the second trenches 34. The resulting active region 22 is shown in FIG. 2G.

An anisotropic poly etch is next performed, which removes the center portions of the poly blocks 40 that are not protected by oxide spacers 48, leaving a pair of opposing poly blocks 40 in each of the second trenches 34, as shown in FIG. 2H. An insulation deposition and anisotropic etch-back process is then used to form an insulation layer 50 along the exposed sides of poly blocks 40a inside second trenches 34 (shown in FIG. 2I). The insulation material could be any insulation material (e.g. ONO—oxide/nitride/ oxide, or other high dielectric materials). Preferably, the insulation material is oxide, so that the oxide deposition/etch process also thickens the oxide spacers 48 and results in the removal of the exposed portions of oxide layer 36 at the bottom of each second trench 34 to expose the substrate 10, as shown in FIG. 2J. In addition, when the oxide layer 36 at the bottom of each trench 34 is removed, the process also removes the oxide in the STI between adjacent columns of active regions 22 in the trench 34.

Suitable ion implantation (and possible anneal) is then made across the surface of the structure to form first (source) regions 52 in the exposed substrate portions at the bottom of second trenches 34. The source regions 52 are self-aligned to the second trenches 34 and form a continuous row that is substantially perpendicular to the column of the active regions 22, and have a second conductivity type (e.g. N type) that is different from a first conductivity type of the substrate (e.g. P type). The ions have no significant effect on the nitride layer 32. The resulting active region 22 is shown in FIG. 2K.

An oxidation deposition step follows and fills the bottom of each trench 34 with a layer of oxide 35 of approximately at least 100 angstroms, and no thicker than the height of the to-be-formed-floating gate-poly block 40 so that capacitive coupling between the to-be-deposited-and formed control gate 54 and the poly block 40 can occur. This is then followed by a poly deposition step, followed by a poly CMP etch (using the nitride layer 32 as an etch stop) are used to fill second trenches 34 with poly blocks 54, as shown in FIG. 2L. Thus, the poly 54 fills each trench 34 in a continuous row. A nitride etch follows, which removes nitride layer 32, and exposes upper edges of the poly blocks 40. A tunnel oxide layer 56 is next formed on the exposed upper edges of poly blocks 40, either by thermal oxidation, oxide deposition, or both. This oxide formation step also forms an oxide layer 58 on the exposed top surfaces of poly blocks 54, as well as possibly thickening oxide layer 30 over substrate 10. Optional Vt implantation in the periphery region can be performed at this time by masking off the active regions 22. The resulting active region 22 is shown in FIGS. 2M and 2N.

Nitride spacers 70 are then formed adjacent to the structure shown in FIG. 2N. This can be accomplished by depositing silicon nitride 70 over the entire surface and then anisotropically etching the nitride forming the spacers 70. The resultant structure is shown in FIG. 2O.

Implant across the entire structure occurs. Specifically, in the regions between the nitride spacers 70 are formed the drain regions 72. The implant energy is sufficient to extend below the isolation oxide. Thus, the drain regions 72 are continuous across the row direction. The resultant structure is shown in FIG. 2P.

The nitride spacers 70 are removed and the resultant structure is shown in FIG. 2Q.

Finally, a poly deposition step is used to form a poly layer 62 over the structure (e.g. approximately 500 Å thick). Photo resist deposition and masking steps follow to form strips of poly layer 62 that are spaced apart from one another each over an active region 22. The resulting active region 22 is shown in FIG. 2R. Each poly layer 62 functions as a word line for the memory array.

As shown in FIG. 2R, the process of the present invention forms an array of memory cells, with each memory cell 15 being between a source regions 52 and a drain region 72 (those skilled in the art would appreciated that the term source and drain may be interchanged during operation.) A non-planar channel region connects the source/drain regions 52/72. with the channel region having two portions: a first portion and a second. The first portion of the channel region is along one of the sidewall of one of the trenches 34, and is adjacent to the first source region 52a. The second portion of the channel region is along the planar surface of the substrate 10 and is between the trench 34 and the drain region 72. A dielectric layer is over the channel region. Over the first portion of the channel region, the dielectric is the layer 36a. Over the second portion of the channel, the dielectric is the layer 30. A floating gate 40a is on the layer 36a, and is over the first portion of the channel region, which is adjacent to the first source region 52a. A gate electrode 62, formed by the poly layer 62, is over the dielectric layer 30 and is over the second portion of the channel region. A control gate 54 is insulated from the source region 52, and is capacitively coupled to the floating gate 40a. Each of the floating gates 40 is substantially perpendicular to the gate electrode 62 and to the surface of the substrate 10. Finally, each source region, e.g. source region 52a, and its associated control gate, e.g. control gate 54a is shared with an adjacent memory cell 15 in the same active region 22, to one side, while the drain region 72 is shared with an adjacent memory cell 15 to another side.

All the floating gates 40 are disposed in trenches 34, with each floating gate 40 facing and insulated from a portion of the channel region. Further, each floating gate 40 includes an upper portion that extends above the substrate surface and terminates in an edge that faces and is insulated from one of the gate electrodes 62, thus providing a path for Fowler-Nordheim tunneling through oxide layer 56. Each control gate 54 extends along and are insulated (by oxide layer 50) from floating gates 44, for enhanced voltage coupling therebetween.

With respect to the plurality of memory cells 15 that form an array, the interconnection is as follows. For memory cells 15 that are in the same column, i.e. in the same active region 22, the word line 62 that forms the gate electrode for each memory cell 15 is extended in the Y direction to each of the memory cells 15. For memory cells 15 that are in the same row, i.e. across the active regions 22 and the STI 26, the source lines 52 and the associated control gates 54 extend continuously in the X direction to each of those memory cells 15. In addition, the drain lines 72 are extended continuously in the X direction to each of the memory cells 15. Finally, as can be seen from the foregoing, memory cells 15 in adjacent rows, share the same source region 52 and the same associated control gate 54 to one side, and share the same drain regions 72 to another side. Each of the memory cells 15 has four independently controllable terminals: word line 62, control gate 54 and drain/source regions 72/52.

As will be appreciated by those skilled in the art, lines 52a, 52b, 52c etc, are buried diffusion lines, and contacts must be made to those lines outside of the array of memory cells. One approach is to use a poly block 54, similar to the control gate 54, however, with the poly block 54 electrically contacting the buried diffusion lines 52a, 52b, 52c etc. outside of the array. Further, the poly block 54 which contacts the buried diffusion lines 52a, 52b, 52c, etc. outside of the array, must not be in electrical contact with the independent control gate 54 that is in the array. Further the lines 72a, 72b, 72c are also buried diffusion lines, and contacts must also be provided to these lines. Thus the array of memory cells 15 is a virtual ground array.

Memory Cell Operation

The operation of the memory cell 15 shown in FIG. 2R will now be described.

Erase

There are two methods for erasing a memory cell 15. First memory cell 15 can be erased by applying 0 volts to the drain 72, and 0 volts to the source region 52. Since the same voltage is applied to both source/drain regions 52/72, no charges will conduct in the channel region. A negative voltage on the order of −8 to −15 volts is applied to the control gate 54. Finally a small positive voltage, on the order of +2 to +4 volts is applied to the word line 62. Because the control gate 54 is highly capacitively coupled to the floating gate 40, the floating gates 40 will experience a high negative voltage. This causes a large voltage differential between the floating gate 40 and the word line 62. Any electrons stored on the floating gate 40 are repelled by the control gate 54 and are pulled by the positive voltage applied to the word line 62, and through the mechanism of Fowler-Nordheim tunneling, the electrons are removed from the floating gate 40, and tunnel through the tunneling oxide 56 onto the word line 62. This mechanism of poly-to-poly tunneling for erase is set forth in U.S. Pat. No. 5,029,130, whose disclosure is incorporated herein in its entirety by reference.

A second method of erasing a memory cell 15 is to apply 0 volts to the drain 72, and a small positive voltage of +2 to +5 volts to the source region 52. A negative voltage on the order of −8 to −15 volts is applied to the control gate 54. Finally a zero or small negative voltage, on the order of 0 to −2 volts is applied to the word line 62. Because the word line 62 is not supplied with a positive voltage, the channel region is not turned on. Further, because the control gate is 54 is highly capacitively coupled to the floating gate 40, the floating gates 40 will experience a negative low voltage. This causes a large voltage differential between the floating gate 40 and the source region 52. Any electrons stored on the floating gate 40 are repelled by the control gate 54 and are pulled by the positive voltage applied to the source region 52, and through the mechanism of Fowler-Nordheim tunneling, the electrons are removed from the floating gate 40, and tunnel through the oxide 35 onto the source region 52.

Programming

Programming of the memory cell 15 can occur as follows. The source region 52 is held at a positive voltage of between +3 to +5 volts. The control gate 54 is held at a positive voltage of between +8 to +10 volts. The word line 62 is held at a positive voltage of 1-3 volts. The drain region 72 is held at ground. Because the control gate 54 is strongly capacitively coupled to the floating gate 40, the positive voltage of +8 to +10 volts on the control gate 54 causes the floating gate 40 to experience a high positive potential, which is sufficient to turn on the first portion of the channel region. The positive voltage of 1-3 volts on the word line 62 is sufficient to turn on the second portion of the channel region. Thus, electrons will traverse in the channel region from the drain region 72 to the source region 52. However, at the junction in the channel region where the channel region takes substantially a 90 degree turn in the direction from the planar surface to the trench 34, the electrons will experience a sudden increase in voltage, caused by the positive high voltage of the floating gate 40. This causes the electrons to be hot channel injected onto the floating gate 40. This mechanism of hot channel electron injection for programming is set forth in U.S. Pat. No. 5,029,130, whose disclosure is incorporated herein in its entirety by reference.

Read

Reading of the memory cell 15 can occur as follows. The source region 52 is held at a ground voltage. The control gate 54 is held at a positive voltage of Vdd. The word line 62 is held at a positive voltage of Vdd, which is normally sufficient to turn on the second portion of the channel region. The drain region 52 is held at a small positive voltage such as +1.0 volts. The positive voltage of Vdd on the control gate 54 is sufficient to turn on the first portion of the channel region if the floating gate 40 is not programmed. In that event, electrons will traverse in the channel region from the source region 52 to the drain region 72. However, if the floating gate 40 is programmed, then the positive voltage of Vdd on the control gate 54 is not sufficient to turn on the first portion of the channel region. In that event, the channel remains non-conductive. Thus, the amount of current or the presence/absence of current sensed at the drain region 72 determines the state of programming of the floating gate 40.

Memory Cell Array Operation

The operation of an array of memory cells 15 will now be described. Schematically, an array of memory cells is shown in FIG. 3. As shown in FIG. 3, an array of memory cells 15 comprises a plurality of memory cells arranged in a plurality of columns: 15$a$(1-3) and 15$b$(1-3), and in rows: 15($a$-$b$)1, 15($a$-$b$)2 and 15($a$-$b$)3. The word line 62 connected to a memory cell 15 is also connected to other memory cells 15 in the same column. The source regions 52 and the control gates 54 connect to the cells 15 in the same row and is shared by memory cells 15 to either side. The drain regions 72 connect to the cells in the same row and is shared by memory cells to either side. A memory cell 15 in one row has a common drain region 72 with a memory cell 15 to one side, and has a common source region 52 and control gate 72 with a memory cell to another side.

Erase

In the erase operation, as previously discussed there are two possible modes of operation. In the first mode, individual memory cells 15 can be erased. The voltage supplied to the various lines are as follows. For the drain region 72 to the selected memory cell 15, ground voltage is supplied. For the drain region 72 to the unselected memory cell 15, ground voltage is also supplied. For the source region 52 to the selected memory cell 15, ground voltage is supplied. For the source region 52 to the unselected memory cell 15, ground voltage is also supplied. For the word line 62 to the selected memory cell 15 a positive voltage of approximately +2 to +4 volts is supplied. For the word line 62 to the unselected memory cells 15, ground voltage is supplied. Finally, for the control gate 54 to the selected memory cell 15, a high negative voltage, on the order of −8 to −15 volts is supplied. For the control gate 54 to the unselected memory cells 15, ground voltage is supplied.

As previously discussed, for the selected memory cell 15, the high capacitance of the control gate 54 to the floating gate 40 causes the floating gate 40 to experience a high negative voltage. The positive voltage on the adjacent word line 62 causes the electrons to be attracted thereto and through the mechanism of Fowler-Nordheim tunneling, electrons are removed from the floating gate 54. For the unselected memory cells 15 in the same column, although the small positive voltage of +2 to +4 volts is applied to the word line 62, because the control gate 54 of the unselected memory cells 15 are held at ground, the electrons on the floating gate 40 of the unselected memory cells 15 in the same column will not be attracted to the word line 62. As for the unselected memory cells 15 in the same row, although the control gate 54 has a high negative voltage supplied thereto, the corresponding word line 62 is held at ground. Thus, there is no positive voltage to attract the electrons from the floating gate 40 of the unselected memory cells 15. In this mode, erase is bit-selectable.

In the second mode of erasure, the various voltage applied are as follows. For the drain region 72 to the selected memory cell 15, ground voltage is supplied. For the drain region 72 to the unselected memory cell 15, ground voltage is also supplied. For the source region 52 to the selected memory cell 15, a small positive voltage of +2 to +5 volts is supplied. For the source region 52 to the unselected memory cell 15, ground voltage is supplied. For the word line 62 to the selected memory cell 15 a ground to small negative voltage of approximately 0 to −2 volts is supplied. For the word line 62 to the unselected memory cells 15, a ground to small negative voltage of approximately 0 to −2 volts is supplied. Finally, for the control gate 54 to the selected memory cell 15, a high negative voltage, on the order of −8 to −15 volts is supplied. For the control gate 54 to the unselected memory cells 15, ground voltage is supplied.

In this mode of operation all of the memory cells 15 in the same row are erased at the same time. Thus, in this mode, erase is row selectable. For the memory cell 15 in the selected row, the high capacitance of the control gate 54 to the floating gate 40 causes the floating gate 40 to experience a high negative voltage. The positive voltage on the adjacent source region 52 causes the electrons to be attracted thereto and through the mechanism of Fowler-Nordheim tunneling, electrons are removed from the floating gate 54. For the memory cells 15 in the unselected rows, the control gate 54 is held at ground. Finally, the ground to negative voltage supplied to all of the word lines 62 ensures that the channel regions of all the memory cells 15 will not be turned on.

Program

Let us assume that the floating gate 40 of the memory cell 15*b*2 is to be programmed. Then based upon the foregoing discussion, the voltages applied to the various lines are as follows: line 72*b* is at ground while all other drain regions 72*a* are at Vdd; line 52*a* is at +3 to +5 volts while all other source lines 52*b* are at ground; line 62*b* is at +1 to +3 volts while all other word line 62*a* are at ground to −2 volts; line 54*a* is at +8 to +10 volts while all other lines 54*b* Are at ground. The "disturbance" on the unselected memory cells 15 is as follows:

For the memory cells 15 in the unselected column, the application of 0 volts to −2 volts to the word lines 62*a* means that none of the channel regions for those memory cells 15*a*(1-n) and 15*c*(1-n) are turned on, because the second portion of the channel region (the portion to which the word line 62*a* controls) is not turned on. Thus, there is no disturbance. For the memory cell 15*b*1 which is in the same selected column, but in an unselected row to the side having the source region 52 and control gate 54 in common with the selected memory cell 15, the application of Vdd to line 72*a* means that little or no current will conduct in the memory cell 15*b*1. Finally for the memory cell 15*b*3 which is in the same selected column, but in an unselected row to the side having the drain region 72 in common with the selected memory cell 15, the application of ground to line 54*b* and 52*b* means that little or no current will conduct in the memory cell 15*b*3.

Read

Let us assume that the floating gate 40 of the memory cell 15*b*2 is to be read. Then based upon the foregoing discussion, the voltages applied to the various lines are as follows: The drain region line 72*b* is held at a positive voltage of about +1 volt, while the unselected drain lines 72*a* are held at ground. The control gate line 54*a* is held at a positive voltage of Vdd, while the unselected control gates 54*b* are held at ground. The selected word line 62*b* is held at a positive voltage of Vdd, while the unselected word lines 62*a* are held at ground. Finally, the selected source line 52*a* is held at ground, while the unselected source lines 52*b*, immediately adjacent to the selected drain line 72*b* is held at 1 volt, while the unselected source line 52 immediately adjacent to the unselected drain line 72*a* is held at ground. Thus all of the memory cells 15 to one side of the selected memory cell 15 would have the same voltages applied to the source 52 and drain 72, while all of the memory cells to another side would similarly have the same voltages applied to the source 52 and drain 72. The "disturbance" on the unselected memory cells 15 is as follows:

For the memory cells 15 in the unselected columns, the application of 0 volts to word line 62 means that none of the channel regions for those memory cells 15 is turned on. Thus, there is no disturbance. For the memory cells 15*b*1 and 15*b*3 that are in the same selected column, but are unselected rows, the application of the same voltage to the source/drain 52/72 of those memory cells means that the channel region will also not be turned on. Thus, little or no disturbance to memory cell 15*b*2 would occur.

From the foregoing it can be seen that a novel, high density non-volatile memory cell, array and method of manufacturing is disclosed. It should be appreciated that although the preferred embodiment has been described in which a single bit is stored in each of the floating gate in a memory cell, it is also within the spirit of the present invention to store multi-bits on the floating gate in a single memory cell, thereby increasing further the density of storage.

What is claimed is:

1. A non-volatile memory cell comprising:
   a substantially single crystalline semiconductive material of a first conductivity type, having a substantially planar surface with a trench in said surface of said material; said trench having a sidewall and a bottom wall;
   a first region of a second conductive type, different from said first conductivity type in said material along said planar surface;
   a second region of a second conductive type in said material along said bottom wall of said trench;
   a channel region, having a first portion and a second portion, connecting said first and second regions for the conduction of charges, wherein said first portion is along said surface adjacent to said first region, and said second portion is along said sidewall adjacent to said second region;
   a dielectric on said channel region;
   a floating gate in said trench, on said dielectric, spaced apart from said second portion of said channel region;
   a first gate electrode on said dielectric, spaced apart from said first portion of said channel region; and
   a second gate electrode, in said trench, capacitively coupled to said floating gate, and to said second region.

2. The cell of claim 1 wherein said substantially single crystalline semiconductive material is single crystalline silicon.

3. The cell of claim 1 wherein said floating gate having a tip substantially adjacent to said first gate electrode.

4. The cell of claim 3 further comprising a second dielectric between said tip and said first gate electrode permitting the Fowler-Nordheim tunneling of electrons from said floating gate to said first gate electrode.

5. The cell of claim 1 further comprising a second dielectric between said floating gate and said bottom wall of said trench permitting the Fowler-Nordheim tunneling of electrons from said floating gate to said second region.

6. An array of non-volatile memory cells, arranged in a plurality of rows and columns, said array comprising:
   a substantially single crystalline semiconductive material of a first conductivity type, having a substantially planar surface with a plurality of trenches in said surface of said material; each of said trenches having a sidewall and a bottom wall;
   a plurality of non-volatile memory cells arranged in a plurality of rows and columns in said semiconductive substrate material with each cell comprising:
      a first region of a second conductive type, different from said first conductivity type in said material along said surface;
      a second region of said second conductive type in said material along said bottom wall of said trench;
      a channel region, having a first portion and a second portion, connecting said first and second regions for the conduction of charges, wherein said first portion is along said surface adjacent to said first region, and said second portion is along said sidewall adjacent to said second region;
      a dielectric on said channel region;
      a floating gate on said dielectric, spaced apart from said second portion of said channel region;
      a first gate electrode on said dielectric, spaced apart from said first portion of said channel region; and
      a second gate electrode, in said trench, capacitively coupled to said floating gate, and to said second region;
   wherein said cells in the same row have said first gate electrode in common;
   wherein said cells in the same column have said first region in common, said second region in common, said second gate electrode in common; and
   wherein said cells in adjacent columns have said first region in common to one side; and said second gate electrode and said second region in common to another side.

7. The array of claim 6 wherein said substantially single crystalline semiconductive material is single crystalline silicon.

8. The array of claim 6 wherein in each cell the floating gate has a tip substantially adjacent to the first gate electrode.

9. The array of claim 8 wherein each cell further comprising a second dielectric between said tip and said first gate electrode permitting the Fowler-Nordheim tunneling of electrons from said floating gate to said first gate electrode.

10. The array of claim 6 wherein each cell further comprising a second dielectric between said floating gate and said bottom wall of said trench permitting the Fowler-Nordheim tunneling of electrons from said floating gate to said second region.

11. The array of claim 6 wherein an isolation region separates adjacent rows of cells.

12. A method of manufacturing an array of non-volatile memory cells in a substantially single crystalline semiconductive substrate material of a first conductivity type, wherein said array of non-volatile memory cells has a plurality of non-volatile memory cells arranged in a a plurality of rows and columns in said semiconductive substrate material, said method comprising:
   forming spaced apart isolation regions on said semiconductive substrate that are substantially parallel to one another and extend in said column direction, with an active region between each pair of adjacent isolation regions, wherein said semiconductive substrate has a substantially planar surface;
   forming a plurality of memory cells in each of the active regions, wherein the formation of each of the memory cells includes:
      forming a trench into the surface of the substrate, said trench having a sidewall and a bottom wall;
      forming a floating gate in the wench along the sidewall and insulated therefrom;
      forming a first region in said substrate along the bottom wall of the trench, with said first region being of a second conductivity type, different from said first conductivity type;
      forming a first gate electrode in the trench, said first gate electrode insulated from said first region and capacitively coupled to said floating gate;
      forming a second region, of the second conductivity type in said substrate, along the surface thereof, spaced apart from the trench; and
      forming a second gate electrode spaced apart from the surface between said second region and said trench.

13. The method of claim 12 wherein said step of forming said first gate electrode includes forming said first gate electrode continuously in said row direction across a plurality of columns.

14. The method of claim 12 wherein said step of forming said second gate electrode includes forming said second gate electrode continuously in said column direction across a plurality of rows.

15. The method of claim 14 wherein said step of forming said first region and said second region includes forming said first region and said second region continuously in said row direction across a plurality of columns.

16. The method of claim 15 wherein said cells in the same row have said second gate electrode in common; and wherein said cells in the same column have said first region in common, said second region in common, said first gate electrode in common; and wherein said cell in adjacent columns have said second region in common to one side; and said first gate electrode and said first region in common to another side.

17. A method of manufacturing a non-volatile memory cell in a substantially single crystalline semiconductive substrate of a first conductivity type, said substrate having a substantially planar surface, said method comprising:
   forming a trench into the surface of the substrate, said trench having a sidewall and a bottom wall;
   forming a floating gate in the trench along the sidewall and insulated therefrom;
   a first region in said substrate along the bottom wall of the trench, with said first region being of a second conductivity type, different from said first conductivity type;
   forming a first gate electrode in the trench, said first gate electrode insulated from said first region and capacitively coupled to said floating gate;
   forming a second region, of the second conductivity type in said substrate, along the surface thereof, spaced apart from the trench; and forming a second gate electrode spaced apart from the surface between said second region and said trench.

18. The method of claim 17 further comprising forming an insulation material between the second gate electrode and said floating gate with a thickness that permits Fowler-Nordheim tunneling of electrons from said second floating gate to said second gate electrode.

19. The method of claim 17 further comprising forming an insulation material between said floating gate and said bottom wall of said trench permitting the Fowler-Nordheim tunneling of electrons from said floating gate to said second region.

20. The method of claim 18 wherein said step of forming said floating gate includes forming said floating gate above the substrate surface.

* * * * *